United States Patent [19]

Nakamura et al.

[11] Patent Number: 5,776,786
[45] Date of Patent: Jul. 7, 1998

[54] METHOD FOR WIRE-BONDING A COVERED WIRE

[75] Inventors: Osamu Nakamura, Kokubunji; Kazumasa Sasakura, Musashi Murayama, both of Japan

[73] Assignee: Kabushiki Kaisha Shinkawa, Tokyo, Japan

[21] Appl. No.: 759,229

[22] Filed: Dec. 5, 1996

[30] Foreign Application Priority Data

May 12, 1995 [JP] Japan .................. 7-344553

[51] Int. Cl.$^6$ .................. H01L 21/283; H01L 21/603
[52] U.S. Cl. .................. 437/8; 437/183; 437/204; 228/180.5; 228/904
[58] Field of Search .................. 437/8, 183 B, 437/209 B, 204; 228/180.5, 904; 29/850

[56] References Cited

U.S. PATENT DOCUMENTS 4,597,522  7/1986  Kibayashi .................. 228/179
4,864,514  9/1989  Yamanaka .................. 364/489

FOREIGN PATENT DOCUMENTS 2-213146  8/1990  Japan .................. H01L 21/60

*Primary Examiner*—David Graybill
*Attorney, Agent, or Firm*—Koda and Androlia

[57] ABSTRACT

To assure that a loop height remains constant even if the wiring distance should vary and no slack is generated in the hypotenuse of the bonded wire: the length of the covered wire required for a next wiring operation is set by a formula which combines a first-order function of a wiring distance, a first-order reciprocal function of the wiring distance and a constant; the covering-film at the corresponding position is removed; and the exposed-core portion of the covered wire from which the covering-film has been removed is bonded to the lead of a lead frame with the loop height fixed even if the wiring distance should change.

2 Claims, 2 Drawing Sheets

METHOD FOR WIRE-BONDING A COVERED WIRE

BACKGROUND OF THE INVENTION

1. Field of the Invention

The present invention relates to a method for wire-bonding a covered wire.

2. Prior Art

Conventionally, as a method for wire-bonding a covered wire, a method disclosed in Japanese Patent Application Laid-Open (Kokai) No. 2-213146 has been known. This method is disclosed in FIG. 1. A covered wire 1 is comprised of a core wire 1a, which is a conductor, and a covering-film 1b, which consists of a macromolecular resin material with electrical insulating properties and is covered as a coating around the circumference of the core wire 1a. The covered wire 1 is supplied from a wire spool, which is not shown in the Figures, and passed through a capillary 4 via a second damper 2, which is for holding the wire, and a first damper 3, which is for cutting the wire. The covered wire 1 thus passing through the capillary 4 is connected to the pad of a semiconductor pellet 5 and the lead 6a of a lead frame 6.

FIG. 1(a) shows a state in which a ball 1c has been formed at the tip of the covered wire 1, and the first damper 3 and second damper 2 are opened. Furthermore, a removed portion (exposed portion 1d) has been formed beforehand by a method which will be described below in an area extending for a predetermined distance from the tip of the covered wire 1. As seen from FIGS. 1(a) to 1(b), the capillary 4 is lowered so that the ball 1c is bonded to the first bonding point of a pad of the semiconductor pellet 5. Next, the capillary 4 is raised, moved to a point above one of the leads 6a of the lead frame 6 and then lowered; and as shown in FIG. 1(c), the exposed portion 1d is bonded to the second bonding point of the lead 6a.

Next as shown in FIG. 1(d), the capillary 4 is raised by a distance $L_1$ from the surface of the lead 6a. This distance $L_1$ is calculated by use of information concerning the first and second bonding positions and the initial set conditions of the bonding apparatus, etc., as described in Japanese Patent Application Laid-Open No. 2-213146. When the first damper 3 and the capillary 4 are thus raised by a distance $L_1$, the first damper 3 closes and holds the covered wire 1. Next, with the first damper 3 closed, the damper 3 is raised together with the capillary 4; and as shown in FIG. 1(e), the covered wire 1 is cut from the base area of the second bonding point. In this case, the first damper 3 and the capillary 4 are raised so that an intended coveringfilm removal area 1e comes between the pair of discharge electrodes 7 and 8. As result, the covered wire 1 protrudes from the tip of the capillary 4 by the length $L_1$, and a part of the exposed portion 1d remains at the tip of the covered wire 1.

Next, as shown in FIG. 1(f), the pair of discharge electrodes 7 and 8 are moved in close to the covered wire 1 from both sides in a non-contact state. A voltage is then applied to the discharge electrodes 7 and 8 so that an electric discharge is caused to take place between the electromagnetic parts 71 and 81 and the core wire 1a with the covering-film 1b in between. As a result of the discharge energy, as shown in FIG. 1(g), a portion of the covering-film 1b located at a predetermined position on the covered wire 1 is removed. In other words, the exposed portion 1d shown in FIG. 1(a) is formed. Next, as shown in FIG. 1(g), the discharge electrodes 7 and 8 are withdrawn in a direction away from the covered wire 1.

Next, as shown by the chain lines, the second damper 2 is closed, and the first damper 3 is opened. Afterward, as shown in FIG. 1(h), the first damper 3 and the capillary 4 are lowered, in relative terms, by a distance $L^2$ from the state shown in FIG. 1(g). In this case, since the covered wire 1 is held (restrained) by the second damper 2, the covered wire 1 is brought into the interior of the capillary 4 by a distance $L^2$, so that the tip of the covered wire 1 protrudes from the tip of the capillary 4 by a tail length $L^3$. In this case, the tail length $L^3$ of the tip of the covered wire 1 corresponds to a part of the exposed portion 1d, from which the covering-film 1b has been removed.

Next, as shown in FIG. 1(i), the first damper 3 is closed, and the second damper 2 is opened; and the capillary 4 is raised to a ball forming level as shown in FIG. 1(j). Next, as shown by chain lines, the discharge electrode 8 is moved so that the electrode surface 8a for ball formation is positioned directly beneath the tip of the covered wire 1. Then, as shown in FIG. 1(k), a high voltage is applied across the discharge electrode 8 and covered wire 1, thus forming the ball 1c. Next, as shown by the chain lines, the discharge electrode 8 is returned to its original position. Then, the first damper 3 is opened, and the capillary 4 is positioned above the next bonding point (see FIG. 1(a)). Afterward, the series of operations shown in FIGS. 1(a) through (k) are repeated.

Thus, in the above-described method for wire-bonding a covered wire, after bonding the lead 6a side, the removal of the covering-film 1b on the lead 6a side of the covered wire 1 that is to be wired next is accomplished as shown in FIG. 1(f). Conventionally, the length $L_4$ of the covered wire 1 required for the next wiring operation which is shown in FIG. 1(f) is calculated by Equation 1 in accordance with FIG. 2, in which $L_6$ is the length required for bonding, and $L_7$ is the length required for formation of the ball 1c. More specifically, in relation to the diameter d (mm) of the core wire 1a of the covered wire 1 and the diameter D (mm) of the ball 1c, the length required for formation of the ball 1c can be expressed as $(\frac{1}{3})\times(D^3/d^2)$, which is a constant $B_1$. Furthermore, when the ball 1c is bonded, the height of the ball is $L_{12}$.

$$L_4 = L_6 + L_7 = L_6 + (\tfrac{1}{3})\times(D^3/d^2) = L_6 + B_1 \quad \text{[Equation 1]}$$

The length $L_6$ required for bonding can be approximated by Equation 2 in terms of the loop height $L_{14}$ and the wiring distance $L_{15}$ (which is the distance between the pad 5a of the semiconductor pellet 5 and the lead 6a of the lead frame 6). Furthermore, the loop height $L_{14}$ is set by Equation 3 as a function of the wiring distance $L_{15}$. In Equation 3, A and $B_2$ are constants. If Equations 2 and 3 are substituted into Equation 1, and the constants are rearranged as $(B_1+B_2)=B$, then $L_4$ can be expressed by Equation 4.

$$L_6 = L_{14} + L_{15} \quad \text{[Equation 2]}$$

$$L_{14} = A \times L_{15} + B \quad \text{[Equation 3]}$$

$$L_4 = (1+A)\cdot L_{15} + B \quad \text{[Equation 4]}$$

Thus, conventionally, the length $L_4$ of the covered wire 1 required for the next wiring operation as shown in FIG. 1(f) is set as shown by Equation 4. The covering-film 1b is removed from the corresponding position, and the exposed-core portion 1d is bonded to the lead 6a of the lead frame 6 in the next wiring operation as shown in FIG. 1(c).

In actual wiring, the loop is formed with the loop height $L_{14}$ fixed. Accordingly, the length $L_{17}$ of the hypotenuse of the loop shown in FIG. 2 can theoretically be expressed by Equation 5. To cite examples, in the case of respective wiring distances $L_{15}$ of 1 mm, 3 mm and 5 mm at a loop height $L_{14}$ of 0.230 mm, the corresponding lengths $L_{17}$ of the hypotenuse as given by Equation 5 are 1.026 mm, 3.009 mm and 5.005 mm.

$$L_{17}=(L_{14}^2+L_{15}^2)^{1/2} \quad \text{[Equation 5]}$$

In the case of the conventional length $L_4$ of the covered wire 1 that is required for the next wiring operation as indicated by Equation 4, the constant B is considered to be the length that is required in order to form the loop height $L_{14}$ shown in FIG. 2 in cases where wiring is to be performed with said loop height $L_{14}$ maintained at a constant value. Accordingly, $(1+A)\cdot L_{15}$ is equal to the length $L_{17}$ of the hypotenuse. In a case where $L_{15}$ is 1 mm, if the loop is set so that $L_{17}=(1+A)\cdot L_{15}$ is equal to the length of the hypotenuse that is theoretically calculated using Equation 5, then A=0.026. In other words, the length $L_{17}$ of the hypotenuse in a conventional case can be expressed by Equation 6.

$$L_{17}=(1+0.026)\cdot L_{15} \quad \text{[Equation 6]}$$

Accordingly, in respective cases where the wiring distance $L_{15}$ is 1 mm, 3 mm and 5 mm, the value of $L_{17}$ as determined theoretically and the value of $L_{17}$ in the case of the conventional Equation 6 are as shown in Table 1.

TABLE 1

| | | | |
|---|---|---|---|
| Wiring distance $L_{15}$ | 1 | 3 | 5 |
| Theoretical hypotenuse length $L_{17}$ | 1.026 | 3.009 | 5.005 |
| Conventional hypotenuse length $L_{17}$ | 1.026 | 3.078 | 5.130 |
| Difference between conventional and theoretical hypotenuse lengths | 0 | 0.069 | 0.125 |

In a conventional system, as is clear from Table 1, the length $L_{17}$ of the hypotenuse becomes larger than the theoretical value as the wiring distance $L_{15}$ increases. In other words, slack is generated in the wire loop. If the length $L_{17}$ of the hypotenuse is set equal to the theoretical value so as to eliminate slack, then the loop height $L_{14}$ increases as the wiring distance $L_{15}$ increases.

SUMMARY OF THE INVENTION

The object of the present invention is to provide a method for wire-bonding a covered wire in which the loop height remains constant even if the wiring distance should vary, and in which no slack is generated in the hypotenuse of the wiring loop.

The first means of the present invention which is used to accomplish the above-described object in a method for wire-bonding a covered wire in which:

the covering-film on an intended lead bonding portion of the covered wire having a length required for a next wiring operation is removed beforehand, a ball formed on the tip of the covered wire is bonded to the pad of a semiconductor pellet, and the covered wire is then fed out from the capillary and an exposed-core portion of the covered wire from which the covering-film has been removed is bonded to the lead of a lead frame, is characterized in that the length of the covered wire required for the next wiring operation is set by means of a formula which combines a first-order function of the wiring distance, a first-order reciprocal function of the wiring distance and a constant, the covering-film at the corresponding position is removed, and the exposed-core portion of the covered wire from which the covering-film has been removed is bonded to the lead of the lead frame with the loop height fixed even if the wiring distance should change.

The second means of the present invention which is used to accomplish the above-described object in a method for wire-bonding a covered wire in which:

the covering-film on an intended lead bonding portion of the covered wire having a length required for a next wiring operation is removed beforehand, a ball formed on the tip of the covered wire is bonded to the pad of a semiconductor pellet, and the covered wire is then fed out from the capillary and an exposed-core portion of the covered wire from which the covering-film has been removed is bonded to the lead of a lead frame, is characterized in that a length $L_4$ of the covered wire required for the next wiring operation is set as $L_4=L_{15}+(A/L_{15})+B$, where B is the length of the covered wire required in order to obtain a loop height of $L_{14}$, B is "$-1+(1L_{14}^2)^{1/2}$", and $L_{15}$ is the wiring distance, the covering-film on the portion of the covered wire located at this length $L_4$ is removed, and the exposed-core portion of the covered wire from which the covering-film has been removed is bonded to the lead of the lead frame with the loop height fixed even if the wiring distance should change.

DETAILED DESCRIPTION OF THE INVENTION

Figure 1:
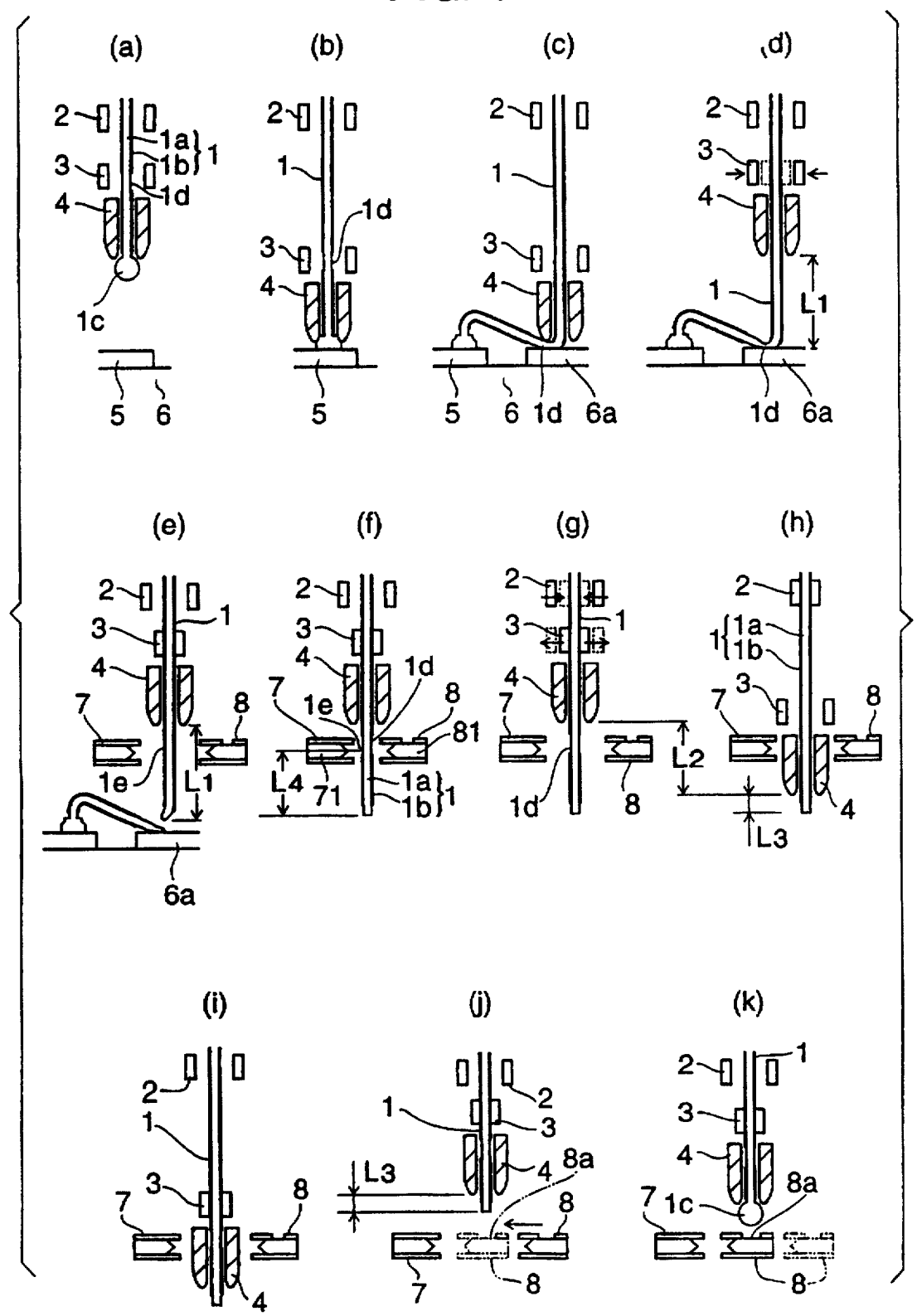
FIGS. 1(a)–(k) ar explanatory diagrams which illustrate one example of the method for wire-bonding a covered wire of the present invention.
Figure 2:
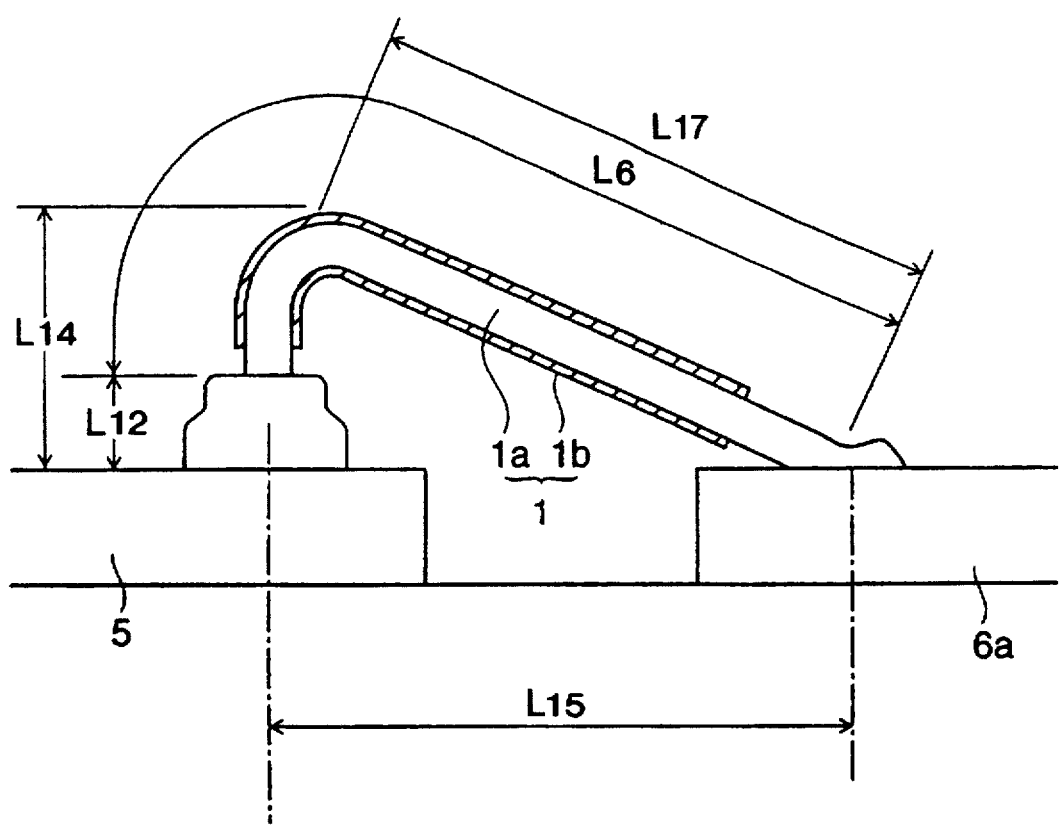
FIG. 2 is an explanatory diagram which shows the wiring state when bonding is completed.

One of the manners of practice of the present invention will be described with reference to FIGS. 1 and 2. The loop height $L_{14}$ is set as a second-order reciprocal function of the wiring distance $L_{15}$ as shown in Equation 7. Therefore, if Equations 2, 3 and 7 are substituted into Equation 1, and the constants are rearranged as $(B_1+B_2)=B$, then the length $L_4$ of the covered wire 1 can be expressed as shown by Equation 8.

$$L_{14}=(A/L_{15}^2)+B_2 \quad \text{[Equation 7]}$$

$$L_4=(1+A/L_{15}^2)\cdot L_{15}+B=L_{15}+(A/L_{15})+B \quad \text{[Equation 8]}$$

Accordingly, if the constant B is taken as the length that is required in order to form a loop height of $L_{14}$ in case where wiring is to be performed with the loop height $L_{14}$ maintained at a constant value as in a conventional system, then "$L_{15}+(A/L_{15})$" in Equation 8 is equal to the length $L_{17}$ of the hypotenuse. Since this $L_{17}(=L_{15}+(A/L_{15}))$ is equal to $L_{17}$ in Equation 5, Equation 9 holds true. If the positive value of A is determined with $L_{15}$ in Equation 9 assumed to be 1 mm, the result is as shown in Equation 10.

$$L_{17}=L_{15}+(A/L_{15})=(L_{14}^2+L_{15}^2)^{1/2} \quad \text{[Equation 9]}$$

$$A=-1+(1+L_{14}^2)^{1/2} \quad \text{[Equation 10]}$$

Accordingly, as in the case described above, A=0.026 when $L_{14}$ is 0.230 mm. In this case, therefore, $L_{17}$ is as shown in Equation 11. In the case of respective wiring distances $L_{15}$ is 1 mm, 3 mm and 5 mm, then the corresponding values of $L_{17}$ are 1.026 mm, 3.009 mm and 5.005 mm and are thus equal to the theoretical values shown in Table 1.

$$L_{17}=L_{15}+(0.026/L_{15}) \qquad \text{[Equation 11]}$$

Accordingly, the length $L_4$ of the covered wire 1 that is required for the next wiring operation as shown in FIG. 1(f) is taken as "$L_{15}+(A/L_{15})+B$" as shown in Equation 8, and the covering-film 1b in the corresponding position is removed. Then, the portion of the length of the covered wire 1 from which the covering-film has been removed is bonded to the lead 6a of the lead frame 6. In this case, B is taken as the loop height $L_{14}$, and A is taken as "$-1+(1+L_{14}^2)^{1/2}$" (as shown in Equation 10). As a result, the loop height $L_{14}$ remains constant even if the wiring distance $L_{15}$ should vary, so that no slack is generated in the hypotenuse of the wire loop.

According to the present invention, in a method for wire-bonding a covered wire in which:

the covering-film on an intended lead bonding portion of the covered wire which is required for a next wiring operation is removed beforehand, a ball formed on the tip of the covered wire is bonded to the pad of a semiconductor pellet, and the covered wire is then fed out from the capillary and an exposedcore portion of the covered wire from which the covering-film has been removed is bonded to the lead of a lead frame;

the length of the covered wire required for the next wiring operation is set by means of a formula which combines a first-order function of the wiring distance, a first-order reciprocal function of the wiring distance and a constant, the covering-film at the corresponding position is removed, and the exposed-core portion of the covered wire from which the covering-film has been removed is bonded to the lead of the lead frame with the loop height fixed even if the wiring distance should change.

Accordingly, even if the wiring distance should vary, the loop height can remain constant, and no slack is generated in the hypotenuse of the wiring [loop].

We claim:

1. A method for wire-bonding a covered wire comprising the steps of:

removing beforehand a covering-film on an intended lead bonding portion of the covered wire having a length required for next wiring operation, bonding a ball formed at a tip of the covered wire to a pad of a semiconductor pellet, and feeding the covered wire out of a capillary and bonding an exposed-core portion of the covered wire from which the covering-film has been removed to a lead of a lead frame;

wherein setting a length of the covered wire required for a next wiring operation by means of a formula which combines a first-order function of a wiring distance, a first-order reciprocal function of the wiring distance and a constant, removing a covering-film at a corresponding position, and bonding an exposed-core portion of the covered wire from which the covering-film has been removed to a lead of the lead frame with a loop height fixed even if the wiring distance is changed.

2. A method for wire-bonding a covered wire comprising the steps of:

removing beforehand a covering-film on an intended lead bonding portion of the covered wire having a length required for next wiring operation, bonding a ball formed at a tip of the covered wire to a pad of a semiconductor pellet, and feeding the covered wire out of a capillary and bonding an exposed-core portion of the covered wire from which the covering-film has been removed to a lead of a lead frame;

wherein setting a length $L_4$ of the covered wire required for a next wiring operation as $L_4=L_{15}+(A/L_{15})+B$, where B is the length of the covered wire required in order to obtain a loop height of $L_{14}$, B is "$-1+(1+L_{14}^2)^{1/2}$", and $L_{15}$ is the wiring distance, removing a covering-film at a corresponding position, and bonding an exposed-core portion of the covered wire from which the covering-film has been removed to a lead of the lead frame with a loop height fixed even if the wiring distance is changed.

* * * * *

UNITED STATES PATENT AND TRADEMARK OFFICE
CERTIFICATE OF CORRECTION

PATENT NO.  : 5,776,786
DATED       : July 7, 1998
INVENTOR(S) : Osamu Nakamura, et al.

It is certified that error appears in the above-indentified patent and that said Letters Patent is hereby corrected as shown below:

Title page,

Item [30] Foreign Application Priority Data:

Change "May 12, 1995  [JP]  Japan ....... 7-344553"
to --Dec. 5, 1995  [JP]  Japan ....... 7-344553--

Signed and Sealed this

Twenty-second Day of September, 1998

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,776,786
DATED : July 7, 1998
INVENTOR(S) : Osamu Nakamura, et al.

It is certified that error appears in the above-indentified patent and that said Letters Patent is hereby corrected as shown below:

In Column 6, line 40 (line 16 of Claim 2) change "B" to --A--.

Signed and Sealed this

Eighth Day of June, 1999

Attest:

Q. TODD DICKINSON

*Attesting Officer*  *Acting Commissioner of Patents and Trademarks*